(12) United States Patent
Flynn et al.

(10) Patent No.: US 8,316,277 B2
(45) Date of Patent: Nov. 20, 2012

(54) APPARATUS, SYSTEM, AND METHOD FOR ENSURING DATA VALIDITY IN A DATA STORAGE PROCESS

(75) Inventors: David Flynn, Sandy, UT (US);
Jonathan Thatcher, Lehi, UT (US);
John Strasser, Syracuse, UT (US)

(73) Assignee: Fusion-IO, Inc., Salt Lake City, UT (US)

( * ) Notice: Subject to any disclaimer, the term of this patent is extended or adjusted under 35 U.S.C. 154(b) by 1015 days.

(21) Appl. No.: 12/098,427

(22) Filed: Apr. 5, 2008

(65) Prior Publication Data
US 2009/0150744 A1 Jun. 11, 2009

Related U.S. Application Data

(63) Continuation-in-part of application No. 11/952,091, filed on Dec. 6, 2007, now Pat. No. 8,266,496.

(51) Int. Cl.
*G06F 11/00* (2006.01)
(52) U.S. Cl. ......................................... 714/763; 714/803
(58) Field of Classification Search ........................ None
See application file for complete search history.

(56) References Cited

U.S. PATENT DOCUMENTS

| | | | |
|---|---|---|---|
| 5,151,905 A | 9/1992 | Yokono et al. |
| 5,261,068 A | 11/1993 | Gaskins et al. |
| 5,291,496 A | 3/1994 | Andaleon et al. |
| 5,313,475 A | 5/1994 | Cromer et al. |
| 5,325,509 A | 6/1994 | Lautzenheiser |
| 5,404,485 A | 4/1995 | Ban |
| 5,438,671 A | 8/1995 | Miles |
| 5,504,882 A | 4/1996 | Chai |
| 5,559,988 A | 9/1996 | Durante et al. |
| 5,594,883 A | 1/1997 | Pricer |
| 5,603,001 A | 2/1997 | Sukegawa et al. |
| 5,701,434 A | 12/1997 | Nakagawa |
| 5,754,563 A | 5/1998 | White |

(Continued)

FOREIGN PATENT DOCUMENTS

GB 0123416 9/2001

OTHER PUBLICATIONS

"White Paper: S2A9550 Overview", DataDirect Networks, www.datadirectnet.com, Jun. 2007, 17 pages.

(Continued)

*Primary Examiner* — Michael Maskulinski
(74) *Attorney, Agent, or Firm* — Kunzler Law Group, PC

(57) ABSTRACT

An apparatus, system, and method are disclosed for ensuring data validity in a data storage process. A data receiver module receives a storage block and existing parity information. An ECC generation module generates error correcting code ("ECC") check bits for the data of the storage block in response to receiving the storage block and the existing parity information. The ECC check bits for the storage block are generated using a block code, a convolutional code, etc. A pre-storage consistency module uses the data of the storage block, the existing parity information, and the ECC check bits to determine if the data of the storage block, the existing parity information, and the ECC check bits are consistent. A data storage module stores the data of the storage block and the ECC check bits the data storage device without storing the existing parity information.

27 Claims, 8 Drawing Sheets

U.S. PATENT DOCUMENTS

| | | |
|---|---|---|
| 5,845,313 A | 12/1998 | Estakhri et al. |
| 5,845,329 A | 12/1998 | Onishi et al. |
| 5,907,856 A | 5/1999 | Estakhri et al. |
| 5,924,113 A | 7/1999 | Estakhri et al. |
| 5,930,815 A | 7/1999 | Estakhri et al. |
| 5,960,462 A | 9/1999 | Solomon et al. |
| 5,961,660 A | 10/1999 | Capps, Jr. et al. |
| 5,969,986 A | 10/1999 | Wong et al. |
| 6,000,019 A | 12/1999 | Dykstal et al. |
| 6,105,076 A | 8/2000 | Beardsley et al. |
| 6,128,695 A | 10/2000 | Estakhri et al. |
| 6,141,249 A | 10/2000 | Estakhri et al. |
| 6,145,051 A | 11/2000 | Estakhri et al. |
| 6,170,039 B1 | 1/2001 | Kishida |
| 6,170,047 B1 | 1/2001 | Dye |
| 6,172,906 B1 | 1/2001 | Estakhri et al. |
| 6,173,381 B1 | 1/2001 | Dye |
| 6,185,654 B1 | 2/2001 | Van Doren |
| 6,223,308 B1 | 4/2001 | Estakhri et al. |
| 6,230,234 B1 | 5/2001 | Estakhri et al. |
| 6,240,040 B1 | 5/2001 | Akaogi et al. |
| 6,330,688 B1 | 12/2001 | Brown |
| 6,356,986 B1 | 3/2002 | Solomon et al. |
| 6,370,631 B1 | 4/2002 | Dye |
| 6,385,710 B1 | 5/2002 | Goldman et al. |
| 6,393,513 B2 | 5/2002 | Estakhri et al. |
| 6,404,647 B1 | 6/2002 | Minne |
| 6,412,080 B1 | 6/2002 | Fleming et al. |
| 6,418,478 B1 | 7/2002 | Ignatius et al. |
| 6,523,102 B1 | 2/2003 | Dye et al. |
| 6,587,915 B1 | 7/2003 | Kim |
| 6,601,211 B1 | 7/2003 | Norman |
| 6,625,685 B1 | 9/2003 | Cho et al. |
| 6,671,757 B1 | 12/2003 | Multer et al. |
| 6,675,349 B1 | 1/2004 | Chen |
| 6,715,046 B1 | 3/2004 | Shoham et al. |
| 6,728,851 B1 | 4/2004 | Estakhri et al. |
| 6,751,155 B2 | 6/2004 | Gorobets |
| 6,754,774 B2 | 6/2004 | Gruner et al. |
| 6,757,800 B1 | 6/2004 | Estakhri et al. |
| 6,775,185 B2 | 8/2004 | Fujisawa et al. |
| 6,779,088 B1 | 8/2004 | Benveniste et al. |
| 6,785,785 B2 | 8/2004 | Piccirillo et al. |
| 6,801,979 B1 | 10/2004 | Estakhri |
| 6,871,257 B2 | 3/2005 | Conley et al. |
| 6,877,076 B1 | 4/2005 | Cho et al. |
| 6,880,049 B2 | 4/2005 | Gruner et al. |
| 6,883,079 B1 | 4/2005 | Priborsky |
| 6,910,170 B2 | 6/2005 | Choi et al. |
| 6,912,618 B2 | 6/2005 | Estakhri et al. |
| 6,938,133 B2 | 8/2005 | Johnson et al. |
| 6,977,599 B2 | 12/2005 | Widmer |
| 6,978,342 B1 | 12/2005 | Estakhri et al. |
| 6,996,676 B2 | 2/2006 | Megiddo |
| 7,000,063 B2 | 2/2006 | Friedman et al. |
| 7,010,652 B2 | 3/2006 | Piccirillo et al. |
| 7,010,662 B2 | 3/2006 | Aasheim et al. |
| 7,043,599 B1 | 5/2006 | Ware et al. |
| 7,050,337 B2 | 5/2006 | Iwase et al. |
| 7,058,769 B1 | 6/2006 | Danilak |
| 7,076,723 B2 | 7/2006 | Saliba |
| 7,082,495 B2 | 7/2006 | DeWhitt |
| 7,082,512 B2 | 7/2006 | Aasheim et al. |
| 7,085,879 B2 | 8/2006 | Aasheim et al. |
| 7,089,391 B2 | 8/2006 | Geiger et al. |
| 7,093,101 B2 | 8/2006 | Aasheim et al. |
| 7,096,321 B2 | 8/2006 | Modha |
| 7,111,140 B2 | 9/2006 | Estakhri et al. |
| 7,149,947 B1 | 12/2006 | MacLellan et al. |
| 7,167,953 B2 | 1/2007 | Megiddo |
| 7,178,081 B2 | 2/2007 | Lee et al. |
| 7,181,572 B2 | 2/2007 | Walmsley |
| 7,194,577 B2 | 3/2007 | Johnson et al. |
| 7,215,580 B2 | 5/2007 | Gorobets |
| 7,219,238 B2 | 5/2007 | Saito et al. |
| 7,243,203 B2 | 7/2007 | Scheuerlein |
| 7,246,179 B2 | 7/2007 | Camara |
| 7,305,520 B2 | 12/2007 | Voigt |
| 7,340,566 B2 | 3/2008 | Voth |
| 7,424,593 B2 | 9/2008 | Estakhri et al. |
| 7,441,090 B2 | 10/2008 | Estakhri et al. |
| 7,450,420 B2 | 11/2008 | Sinclair |
| 7,480,766 B2 | 1/2009 | Gorobets |
| 7,487,320 B2 | 2/2009 | Bansal |
| 7,516,267 B2 | 4/2009 | Coulson et al. |
| 7,523,249 B1 | 4/2009 | Estakhri et al. |
| 7,529,905 B2 | 5/2009 | Sinclair |
| 7,549,013 B2 | 6/2009 | Estakhri et al. |
| 7,552,271 B2 | 6/2009 | Sinclair |
| 7,565,569 B2 | 7/2009 | Zohar et al. |
| 7,631,138 B2 | 12/2009 | Gonzalez et al. |
| 7,644,239 B2 | 1/2010 | Ergan |
| 7,725,628 B1 | 5/2010 | Phan |
| 7,873,803 B2 | 1/2011 | Cheng |
| 7,944,762 B2 | 5/2011 | Gorobets |
| 2002/0069317 A1 | 6/2002 | Chow et al. |
| 2002/0069318 A1 | 6/2002 | Chow et al. |
| 2002/0194451 A1 | 12/2002 | Mukaida et al. |
| 2003/0061296 A1 | 3/2003 | Craddock |
| 2003/0093741 A1 | 5/2003 | Argon et al. |
| 2003/0198084 A1 | 10/2003 | Fujisawa et al. |
| 2004/0186946 A1 | 9/2004 | Lee |
| 2004/0268359 A1 | 12/2004 | Hanes |
| 2005/0002263 A1 | 1/2005 | Iwase et al. |
| 2005/0015539 A1 | 1/2005 | Horii et al. |
| 2005/0027951 A1 | 2/2005 | Piccirillo et al. |
| 2005/0055497 A1 | 3/2005 | Estakhri et al. |
| 2005/0132148 A1 | 6/2005 | Arimilli et al. |
| 2005/0132259 A1 | 6/2005 | Emmot et al. |
| 2005/0144361 A1 | 6/2005 | Gonzalez et al. |
| 2005/0149618 A1 | 7/2005 | Cheng |
| 2005/0149819 A1 | 7/2005 | Hwang |
| 2005/0193166 A1 | 9/2005 | Johnson et al. |
| 2005/0229090 A1 | 10/2005 | Shen et al. |
| 2005/0240713 A1 | 10/2005 | Wu |
| 2005/0246510 A1 | 11/2005 | Retnamma et al. |
| 2006/0004955 A1 | 1/2006 | Ware et al. |
| 2006/0059326 A1 | 3/2006 | Aasheim |
| 2006/0075057 A1 | 4/2006 | Gildea |
| 2006/0107097 A1 | 5/2006 | Zohar et al. |
| 2006/0152981 A1 | 7/2006 | Ryu |
| 2006/0248387 A1 | 11/2006 | Nicholson |
| 2007/0016699 A1 | 1/2007 | Minami |
| 2007/0050571 A1 | 3/2007 | Nakamura |
| 2007/0074092 A1* | 3/2007 | Dammann et al. ............ 714/763 |
| 2007/0086260 A1 | 4/2007 | Sinclair |
| 2007/0162830 A1 | 7/2007 | Stek et al. |
| 2007/0198770 A1 | 8/2007 | Horii et al. |
| 2007/0204197 A1 | 8/2007 | Yokokawa |
| 2007/0204199 A1* | 8/2007 | Chung et al. ................. 714/763 |
| 2007/0233937 A1 | 10/2007 | Coulson |
| 2007/0245217 A1 | 10/2007 | Valle |
| 2007/0271468 A1 | 11/2007 | McKenney et al. |
| 2007/0271572 A1 | 11/2007 | Gupta et al. |
| 2007/0274150 A1 | 11/2007 | Gorobets |
| 2007/0300008 A1 | 12/2007 | Rogers |
| 2008/0022187 A1* | 1/2008 | Bains ............................ 714/763 |
| 2008/0141043 A1 | 6/2008 | Flynn et al. |
| 2009/0043952 A1 | 2/2009 | Estakhri et al. |
| 2009/0083485 A1 | 3/2009 | Cheng |
| 2009/0204750 A1 | 8/2009 | Estakhri et al. |
| 2009/0235017 A1 | 9/2009 | Estakhri et al. |
| 2010/0091535 A1 | 4/2010 | Sommer et al. |
| 2011/0182119 A1 | 7/2011 | Strasser et al. |

OTHER PUBLICATIONS

High Speed Elevated Board Stacking, Samtec Inc., Apr. 2007.
Ismail Ari et al., Performance Boosting and Workload Isolation in Storage Area Networks with SANCache, Proceedings of the 23rd IEEE/14th NASA Goddard Conference on Mass Storage Systems and Technologies, May 2006, pp. 263-273, College Park, MD.
File System Primer, CoolSolutionsWiki, Downloaded Oct. 18, 2006, http://wiki.novell.com/index.php/File_System_Primer.
Morgenstern, Is There a Flash Memory Raid in Your Future, Nov. 8, 2006, Ziff Davis Enterprise Holdings Inc., http://www.eweek.com.
High Speed Elevated Board Stacking, Samtec Inc., 2007.

Leventhal, Flash Storage Memory, Communications of the ACM, Jul. 2008, pp. 47-51, vol. 51, No. 7.

Method for fault tolerance in nonvolatile storage, IP.com PriorArt Database Technical Disclosure, Feb. 3, 2005, IP.com Electric Publication, www.ip.com.

Plank, A Tutorial on Reed-Solomon Coding for Fault-Tolerance in RAID-like Systems, University of Tennessee Department of Computer Science Technical Report CS-96-332, Jul. 1996.

"White Paper: S2A9550 Overview", DataDirect Networks, www.datadirectnet.com, 2007, 17 pages.

"Pivot3 RAIGE Cluster: Technology Overview", White Paper, www.pivot3.com, Jun. 2007, pp. 1-17.

PCT/US2007/086683, International Search Report and Written Opinion, Oct. 26, 2009.

ASPMC_660, Asine Group, http://www.asinegroup.com/products/aspmc660.html, copyright 2002, downloaded on Nov. 18 2009.

BiTMICRO Introduces E-Disk PMC Flash Disk Module at Military & Aerospace Electronics East, May 18, 2004, BiTMICRO, http://www.bitmicro.com/press_news_releases_20040518_prt.php.

NAND Flash 101: An Introduction to NAND Flash and How to Design It in to Your Next Product, Micron, pp. 1-28, Micron Technology Nov. 2006.

PCT/US2007/086683, International Preliminary Report on Patentability, Nov. 5, 2009.

ECC Algorithm, The Leader in Memory Technology, Samsung Electronics, Mar. 2005, http://www.samsung.com/global/business/semiconductor/products/flash/FlashApplicationNote.html.

Am29DL332D/323D/324D Data Sheet, Spansion, Octover 7, 2004, www.amd.com.

Ralph O. Weber, SCSI Object-Based Storage Device Commands (OSD), ANSI, Jul. 30, 2004, pp. 0-74, Part 1 of 3.

Ralph O. Weber, SCSI Object-Based Storage Device Commands (OSD), ANSI, Jul. 30, 2004, pp. 75-164, Part 2 of 3.

Ralph O. Weber, SCSI Object-Based Storage Device Commands (OSD), ANSI, Jul. 30, 2004, pp. 165-171, Part 3 of 3.

Ari, Gottwals, Henze, "Performance Boosting and Workload Isolation in Storage Area Networks with SANcache", Hewlett Packard Laboratories, Proceedings of the 23rd IEEE/ 14th NASA Goddard Conference on Mass Storage Systems Technologies (MSST 2006), May 2006, pp. 263-273.

Plank, James S, "A Tutorial on Reed-Solomon coding for Fault Tolerance in RAID-like Systems", Dept. of computer Science, Univ. of Tennessee, Sep. 1997, pp. 995-1012.

Morgenstern, David, "Is there a Flash Memory RAID in your Future?", Nov. 2006.

"File System Primer", http://wiki.novell.com/index.php/File_System_Primer, Jul. 2006.

"Method for fault tolerance in nonvolatile storage", Ip.com, IPCOM000042269D, Feb. 2005.

Dan, Singer, Implementing MLC NAND Flash for Cost-Effective, High-Capacity Memory, M-systems White paper, Sep. 2003.

Introduction to Samsungs Linux Flash File System—RFS, Samsung Electronics, Nov. 2006.

Mesnier, Ganger, Riedel, "Object-Based Storage", IEEE Comm Magazine, Aug. 2003, pp. 84-90.

Hensbergen, "Dynamic Policy Disk Caching for Storage Networking", Nov. 2006.

PCT/US2007/039572, 2380.2.20pct, International Preliminary Report on Patentability, Oct. 14, 2010.

PCT/US2007/086686, 2380.2.2pct, International Search Report and Written Opinion, Apr. 28, 2008.

PCT/US2007/086686, 2380.2.2pct, International Preliminary Report on Patentability, Dec. 16, 2008.

PCT/US2009/039572, 2380.2.20pct, International Preliminary Report on Patentability, Oct. 14, 2010.

First Office Action, App. No. 200780050974.9, Jul. 27, 2011.

Office Action Received from USPTO, U.S. Appl. No. 11/952,091, Feb. 7, 2012.

Notice of Allowance Received from USPTO, U.S. Appl. No. 12/981,394, Oct. 12, 2011.

PCT/US2009/039572, International Search Report and Written Opinion, Jul. 30, 2009.

Benjauthrit, et al., "An overview of error control codes for data storage", Nonvolatile Memory Technology Conference, 1996, Sixth Biennial, IEEE International, vol. No. pp. 120-126, Jun. 24-26, 1996.

Cardarilli, et al., "Design of fault-tolerant solid state mass memory", Defect and Fault Tolerance in VLSI Systems, 1999, DFT 1999, International Symposium, vol. No. pp. 302-310, Nov. 1999.

* cited by examiner

400

Data

| D8  | D4 | D0 |
| D9  | D5 | D1 |
| D10 | D6 | D2 |
| D11 | D7 | D3 |

402

| P2 | P1 | P0 |

404

Table 1

| 1  |            | i[0] | i[1] | i[2] | i[3] | i[4] |
|----|------------|------|------|------|------|------|
| 2  | IS[0]      | 1    | 1    |      | 1    |      |
| 3  | IS[1]      |      | 1    | 1    |      |      |
| 4  | IS[2]      |      |      | 1    | 1    |      |
| 5  | IS[3]      |      |      |      | 1    |      |
| 6  | IS[4]      | 1    | 1    |      | 1    |      |
| 7  | IS[5]      |      | 1    | 1    |      |      |
| 8  | IS[6]      | 1    | 1    | 1    |      |      |
| 9  | IS[7]      | 1    |      | 1    |      |      |
| 10 | XOR(IS[0:7]) |    | 1    | 1    |      |      |
| 11 | Parity_1a  |      |      |      |      | 1    |
| 12 | Parity_2b  | 1    | 1    | 1    | 1    |      |
| 13 | IS[8]      | 1    |      |      | 1    | 1    |

```
module EncoderPreCalcData(o, i);

output [8:0] IS;
input [4:0] i;

assign IS[0] = i[0]^i[1]^i[3];
  assign IS[1] = i[1]^i[2];
  assign IS[2] = i[2]^i[3];
  assign IS[3] = i[3];
  assign IS[4] = i[0]^i[1]^i[3];
  assign IS[5] = i[1]^i[2];
  assign IS[6] = i[0]^i[1]^i[2];
  assign IS[7] = i[0]^i[2];
  assign IS[8] = i[0]^i[3]^i[4];

endmodule
```

```
module Feedback (o, i, d);

output [8:0] o;
input [8:0] i;
input [8:0] d;

assign o[0] = d[0]^i[4]^i[5]^i[7];
  assign o[1] = d[1]^i[5]^i[6];
  assign o[2] = d[2]^i[6]^i[7];
  assign o[3] = d[3]^i[7];
  assign o[4] = d[4]^i[0]^i[4]^i[5]^i[7];
  assign o[5] = d[5]^i[1]^i[5]^i[6];
  assign o[6] = d[6]^i[2]^i[4]^i[5]^i[6];
  assign o[7] = d[7]^i[3]^i[4]^i[6];
  assign o[8] = d[8]^i[4]^i[7]^i[8];

endmodule
```

FIG. 4A

Table 2

| | | i[0] | i[1] | i[2] | i[3] | i[4] | i[5] | i[6] | i[7] | i[8] |
|---|---|---|---|---|---|---|---|---|---|---|
| 1 | | | | | | | | | | |
| 2 | o[0] | | | | | 1 | 1 | | 1 | |
| 3 | o[1] | | | | | | 1 | 1 | | |
| 4 | o[2] | | | | | | | 1 | 1 | |
| 5 | o[3] | | | | | | | | 1 | |
| 6 | o[4] | 1 | | | | | | | | |
| 7 | o[5] | | 1 | | | | 1 | 1 | | |
| 8 | o[6] | | | 1 | | 1 | 1 | 1 | | |
| 9 | o[7] | | | | 1 | 1 | | 1 | | |
| 10 | XOR(o[0:7]) | 1 | 1 | 1 | 1 | | 1 | 1 | | |
| 11 | Parity_1b | | | | | | | | | 1 |
| 12 | Parity_2b | 1 | 1 | 1 | 1 | 1 | 1 | 1 | 1 | |
| 13 | o[8] | | | | | 1 | | | 1 | 1 |

```
module DecoderPreCalcData(o, i);

output [8:0] o;
input [4:0] i;

assign o[0] = i[0];
  assign o[1] = i[1];
  assign o[2] = i[2];
  assign o[3] = i[3];
  assign o[4] = 0;
  assign o[5] = 0;
  assign o[6] = 0;
  assign o[7] = 0;
  assign o[8] = i[4];

endmodule
```

```
module ConvertSyndrome(o, i);

output [8:0] o;
input [8:0] i;

assign o[0] = i[0]^i[4]^i[7];
  assign o[1] = i[1]^i[4]^i[5]^i[7];
  assign o[2] = i[2]^i[5]^i[6];
  assign o[3] = i[3]^i[6]^i[7];
  assign o[4] = i[0]^i[4]^i[5];
  assign o[5] = i[3]^i[4];
  assign o[6] = i[2]^i[4]^i[7];
  assign o[7] = i[1]^i[2]^i[3]^i[4]^i[6]^i[7];
  assign o[8] = i[0]^i[1]^i[4]^i[8];

endmodule
```

FIG. 4B

APPARATUS, SYSTEM, AND METHOD FOR ENSURING DATA VALIDITY IN A DATA STORAGE PROCESS

CROSS-REFERENCES TO RELATED APPLICATIONS

This application is a continuation-in-part of and claims priority to U.S. patent application Ser. No. 11/952,091 entitled "APPARATUS, SYSTEM, AND METHOD FOR MANAGING DATA USING A DATA PIPELINE" and filed on Dec. 6, 2007 for David Flynn et al., which is incorporated herein by reference.

BACKGROUND OF THE INVENTION

1. Field of the Invention

This invention relates to storing data and more particularly relates to ensuring data validity in a data storage process.

2. Description of the Related Art

When data is moved from a central processing unit ("CPU") or memory of a computer to a data storage device, the data is often transmitted over different buses and networks, is processed, and is finally stored on the data storage device. To protect the data against stuck-bit errors such as address line failures, control line failures, or other hardware failure and to protect against transient errors, such as a bit flip caused by alpha particles, noise, voltage fluctuations, etc. the data is typically protected through each process and transmission using some type of data protection scheme. For example, while data is processed, the data may be protected using some type of parity protection. When the data is transmitted, the data may be encoded such that when the data is received and decoded, data errors can be detected and possibly corrected. Error correcting code ("ECC") may also be used to determine if an error exists in the data when the data is read and to correct errors in the data.

When data is checked and/or decoded at the end of a transmission or process, there may be a few process steps or transmission steps where the data is unprotected creating gaps in protection. In many cases this gap in protection may be deemed insignificant. However, as reliability of data storage systems increases, a gap in error detection and correction protection may become significant. What is needed is a way to increase data validity in a data storage process.

SUMMARY OF THE INVENTION

From the foregoing discussion, it should be apparent that a need exists for an apparatus, system, and method that ensures data validity in a data storage process. Beneficially, such an apparatus, system, and method would ensure that there is no gap in error detection capability.

The present invention has been developed in response to the present state of the art, and in particular, in response to the problems and needs in the art that have not yet been fully solved by currently available data storage systems. Accordingly, the present invention has been developed to provide an apparatus, system, and method for extending data protection that overcome many or all of the above-discussed shortcomings in the art.

The apparatus to extend data protection is provided with a plurality of modules configured to functionally execute the necessary steps of ensuring data validity in a data storage process. These modules in the described embodiments include a data receiver module, an ECC generation module, a pre-storage consistency module, and a data storage module.

The data receiver module receives a storage block and existing parity information for the storage block. The storage block includes data stored together on a data storage device. The storage block includes at least a portion of one or more data packets. The existing parity information is generated for the data of the storage block. The ECC generation module generates error correcting code ("ECC") check bits for the data of the storage block in response to the data receiver module receiving the storage block and the existing parity information. The ECC check bits for the storage block are generated using a block code, a convolutional code, etc.

The pre-storage consistency module uses the data of the storage block, the existing parity information, and the ECC check bits to determine if the data of the storage block, the existing parity information, and the ECC check bits are consistent. The data storage module stores the data of the storage block and the ECC check bits for the storage block on the data storage device. The existing parity information for the storage block is not stored on the data storage device.

In one embodiment, the pre-storage consistency module is independent of the ECC generation module. In another embodiment, the apparatus includes an ECC check bit parity module that uses the ECC check bits to generate ECC check bit parity information. The pre-storage consistency module uses the ECC check bit parity information to determine consistency. In another embodiment, the pre-storage consistency module uses the data of the storage block and the existing parity information in a function independent from the ECC generation module and the ECC check bit parity module to generate alternate parity information that is checked against the ECC check bit parity information to determine consistency.

The apparatus, in a particular embodiment, includes a data retriever module, a parity generation module, an ECC detection module, and a post-storage consistency module. The data retriever module retrieves a storage block with data from one or more data packets stored on the data storage device and ECC check bits for the storage block in response to a read request. The parity generation module generates parity information for the data of the retrieved storage block and for the ECC check bits.

The ECC detection module uses the ECC check bits stored in conjunction with the storage block to generate an ECC syndrome to determine if the data of the retrieved storage block and the generated parity has an error. The post-storage consistency module uses the data from the retrieved storage block, the generated parity information generated by the parity generation module, and the ECC syndrome to determine if the data, generated parity information, and the ECC syndrome are consistent.

In another embodiment, the apparatus includes an ECC correction module that corrects one or more errors in the data of the storage block and updates one or more of parity bits in response to the ECC detection module determining that the data of the retrieved storage block and the generated parity has an error. In another embodiment, the post-storage consistency module is independent of the ECC detection module. In another embodiment, the apparatus includes an ECC syndrome parity module that uses the ECC syndrome to generate ECC syndrome parity information and the post-storage consistency module uses the ECC syndrome parity information to determine consistency. In a further embodiment, the post-storage consistency module uses the data of the retrieved storage block and the generated parity information in a function independent from the ECC detection module and the ECC syndrome parity module to generate alternate parity information that is checked against the ECC syndrome parity information to determine consistency.

In one embodiment, the apparatus includes a post-retrieval parity check module that checks parity of the retrieved storage block and the ECC check bits using the generated parity information from the retrieved storage block and ECC check bits in response to the ECC detection module completing determining if the data of the retrieved storage block has an error. In another embodiment, the apparatus includes a pre-storage parity check module that checks parity of the data of the storage block received by the data receiver module using the existing parity information and the parity of the ECC check bits. The parity check module checks parity prior to the data storage module storing the storage block and ECC check bits.

In one embodiment, the ECC generation module includes generating an error checking code for the existing parity information of the storage block, the error checking code stored with the ECC check bits for the storage block. In a related embodiment, the error checking code for the existing parity information includes parity check bits, check code, and/or ECC check bits. In yet another embodiment, the ECC generation module includes generating ECC check bits for the data of the storage block combined with the existing parity information such that the generated ECC check bits do not distinguish between data and parity information.

In one embodiment, a data packet includes at least a portion of a data segment received in conjunction with a storage request and the apparatus includes a decoding module that decodes data of the data segment, resulting in parity and un-encoded data of the data segment, in a single process step such that there is no gap in error detection capability. In another embodiment, the apparatus includes a parity consistency module that maintains no gap in error detection capability by using parity information for the data of the data segment from the decoding module generating the parity until the data receiver module receives the parity and the data in the form of the storage block, wherein the parity consistency module maintains parity through at least one of encrypting the data, compressing the data, and a user-defined, application-specific function.

In one embodiment, the ECC check bits for the storage block are generated using one of a BCH code, Reed-Solomon code, and a turbo code. In another embodiment, the data storage module does not store parity information of the ECC check bits.

A system of the present invention is also presented to extend data protection. The system may be embodied by a data storage device and a storage controller that controls storage of data in the data storage device. In particular, the system, in one embodiment, includes a data receiver module, an ECC generation module, a pre-storage consistency module, and a data storage module.

The data receiver module receives a storage block and existing parity information for the storage block. The storage block includes data stored together on the data storage device. The storage block includes at least a portion of one or more data packets. The existing parity information is generated for the data of the storage block. The ECC generation module generates ECC check bits for the data of the storage block in response to the data receiver module receiving the storage block and the existing parity information. The ECC check bits for the storage block are generated using a block code, a convolutional code, etc.

The pre-storage consistency module uses the data of the storage block, the existing parity information, and the ECC check bits to determine if the data of the storage block, the existing parity information, and the ECC check bits are consistent. The data storage module stores the data of the storage block and the ECC check bits for the storage block on the data storage device. The existing parity information for the storage block is not stored on the data storage device.

In one embodiment, the system includes one or more system buses and networks. The storage controller receives a data segment from a CPU and/or a memory over a system bus or a network and the data segment includes the data of the one or more data packets. The data segment is received in conjunction with a storage request to store the data segment. In another embodiment, the system includes an overall consistency module that maintains protection of the data with no gap in error detection capability from receipt of the data by the system until the data storage module stores the data of the data segment. The overall consistency module includes a sub-module associated with each transition from one data protection scheme to another.

In another embodiment, the overall consistency module includes a decoding module that decodes data of the data segment, resulting in parity and un-encoded data of the data segment, in a single process step such that there is no gap in error detection capability from when the data is in an encoded form to when the data includes parity information. In another embodiment, the overall consistency module includes an encoding module that encodes data of the data segment protected with parity information, resulting in encoded data of the data segment, in a single process step such that there is no gap in error detection capability from when the data includes parity information to when the data is in an encoded form.

In yet another embodiment, the overall consistency module includes a parity consistency module that maintains no gap in error detection capability by using parity information for the data of the data segment from when parity information is generated for the data of the data segment until the data receiver module receives the existing parity information and the data in the form of the storage block. The parity consistency module maintains no gap in error detection capability from when the data retriever module retrieves the storage block and the parity generation module generates parity information for the data until the data protected using parity information is encoded by an encoding module that encodes data of the data segment. The parity consistency module maintains parity through at least one of encrypting the data, compressing the data, decrypting the data, decompressing the data, and a user-defined, application-specific function.

In another embodiment, the system further includes at least one of a CPU and a memory from which the storage controller receives the data segment. In another embodiment, the overall consistency module also maintains protection of the data with no gap in error detection capability from when the data is retrieved from the data storage device until the data is delivered from the system.

A method of the present invention is also presented for extending data protection. The method in the disclosed embodiments substantially includes the steps necessary to carry out the functions presented above with respect to the operation of the described apparatus and system. In one embodiment, the method includes receiving a storage block and existing parity information for the storage block. The storage block includes data stored together on a data storage device. The storage block includes at least a portion of one or more data packets. The existing parity information is generated for the data of the storage block. The method includes generating ECC check bits for the data of the storage block in response to receiving the storage block and the existing parity information. The ECC check bits for the storage block are generated using a block code, a convolutional code, etc.

The method includes using the data of the storage block, the existing parity information, and the ECC check bits to determine if the data of the storage block, the existing parity information, and the ECC check bits are consistent. The method includes storing the data of the storage block and the ECC check bits for the storage block on the data storage device in response to determining that the data of the storage block, the existing parity information, and the ECC check bits are consistent, wherein the existing parity information for the storage block is not stored on the data storage device.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussion of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize that the invention may be practiced without one or more of the specific features or advantages of a particular embodiment. In other instances, additional features and advantages may be recognized in certain embodiments that may not be present in all embodiments of the invention.

These features and advantages of the present invention will become more fully apparent from the following description and appended claims, or may be learned by the practice of the invention as set forth hereinafter.

BRIEF DESCRIPTION OF THE DRAWINGS

In order that the advantages of the invention will be readily understood, a more particular description of the invention briefly described above will be rendered by reference to specific embodiments that are illustrated in the appended drawings. Understanding that these drawings depict only typical embodiments of the invention and are not therefore to be considered to be limiting of its scope, the invention will be described and explained with additional specificity and detail through the use of the accompanying drawings, in which:

FIG. 4A is a first part of an example of determining if data, parity, and ECC are consistent in accordance with the present invention;

FIG. 4B is a second part of an example of determining if data, parity, and ECC are consistent in accordance with the present invention;

DETAILED DESCRIPTION OF THE INVENTION

Figure 1:
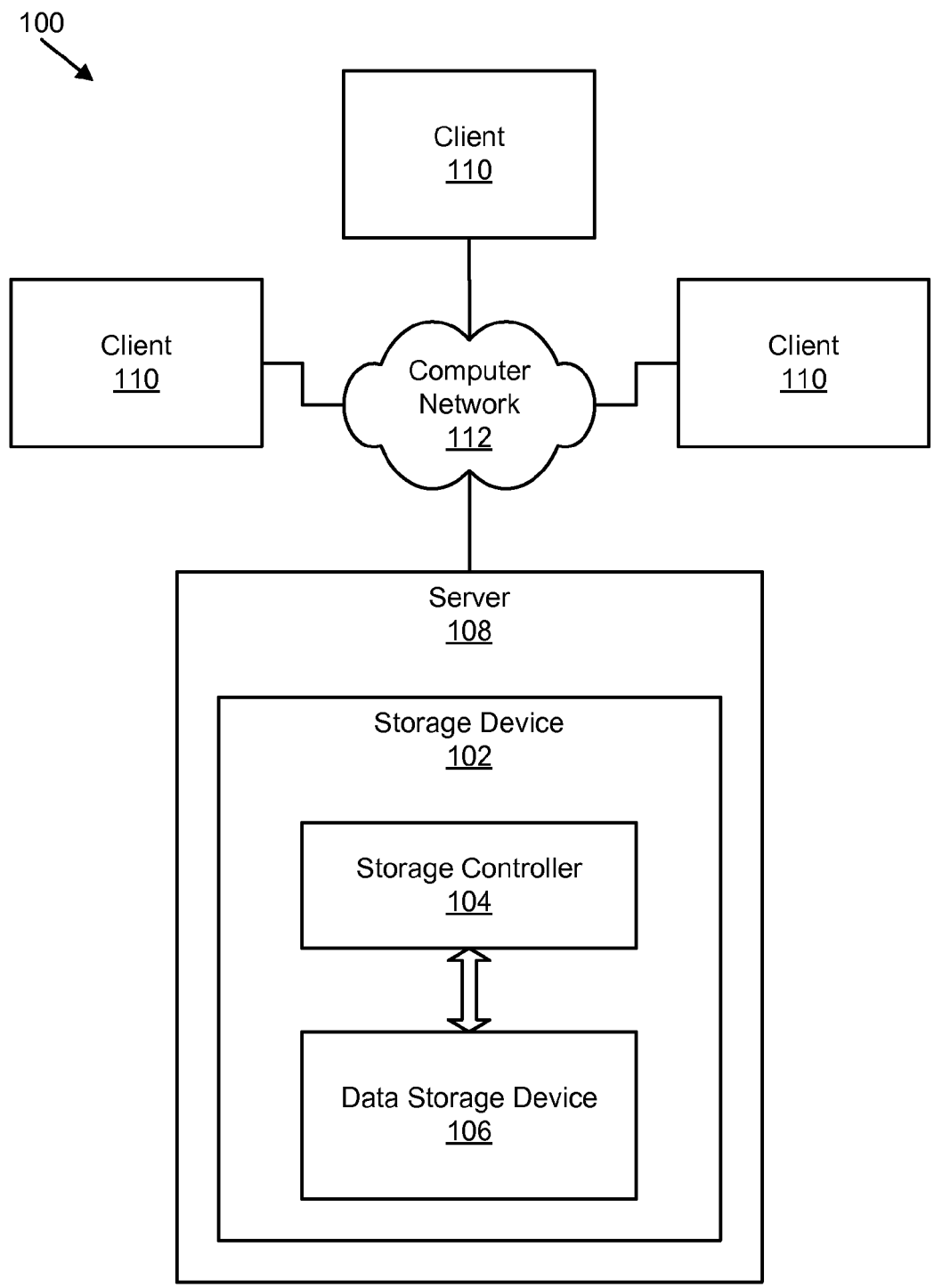
FIG. 1 is a schematic block diagram illustrating one embodiment of a system for increasing data protection in a data storage process in accordance with the present invention.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices or the like.

Modules may also be implemented in software for execution by various types of processors. An identified module of executable code may, for instance, comprise one or more physical or logical blocks of computer instructions which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of executable code may be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different storage devices, and may exist, at least partially, merely as electronic signals on a system or network. Where a module or portions of a module are implemented in software, the software portions are stored on one or more computer readable media.

Reference throughout this specification to "one embodiment," "an embodiment," or similar language means that a particular feature, structure, or characteristic described in connection with the embodiment is included in at least one embodiment of the present invention. Thus, appearances of the phrases "in one embodiment," "in an embodiment," and similar language throughout this specification may, but do not necessarily, all refer to the same embodiment.

Reference to a computer readable medium may take any form capable of storing machine-readable instructions on a digital processing apparatus. A computer readable medium may be embodied by a transmission line, a compact disk, digital-video disk, a magnetic tape, a Bernoulli drive, a magnetic disk, a punch card, flash memory, integrated circuits, or other digital processing apparatus memory device.

Furthermore, the described features, structures, or characteristics of the invention may be combined in any suitable manner in one or more embodiments. In the following description, numerous specific details are provided, such as examples of programming, software modules, user selections, network transactions, database queries, database structures, hardware modules, hardware circuits, hardware chips, etc., to provide a thorough understanding of embodiments of the invention. One skilled in the relevant art will recognize, however, that the invention may be practiced without one or more of the specific details, or with other methods, components, materials, and so forth. In other instances, well-known structures, materials, or operations are not shown or described in detail to avoid obscuring aspects of the invention.

The schematic flow chart diagrams included herein are generally set forth as logical flow chart diagrams. As such, the depicted order and labeled steps are indicative of one embodiment of the presented method. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method. Although various arrow types and line types may be employed in the flow chart diagrams, they are understood not to limit the scope of the corresponding method. Indeed, some arrows or other connectors may be used to indicate only the logical flow of the method. For instance, an arrow may indicate a waiting or monitoring period of unspecified duration between enumerated steps of the depicted method. Additionally, the order in which a particular method occurs may or may not strictly adhere to the order of the corresponding steps shown.

FIG. 1 is a schematic block diagram illustrating one embodiment of a system 100 for increasing data protection in a data storage process in accordance with the present invention. The system 100 includes a storage device 102 that includes a storage controller 104 and a data storage device 106. The storage device 102 is within a server 108 connected to one or more clients 110 through a computer network 112.

In one embodiment, the system 100 includes a storage device 102 with a storage controller 104 and a data storage device 106. The storage controller 104 and data storage device 106 may be included in a single enclosure that is the storage device 102. In another embodiment, the storage controller 104 and the data storage device 106 are separate. The storage controller 104 typically controls data storage and access for the data storage device 106. The data storage device 106, in one embodiment, is capable of substantially similar access times to data throughout the data storage device 106. For example, the data storage device 106 may be a solid-state storage device, such as flash memory, nano random access memory ("nano RAM or NRAM"), magneto-resistive RAM ("MRAM"), dynamic RAM ("DRAM"), phase change RAM ("PRAM"), etc. The data storage device 102 may also be a hard disk drive, a compact disk ("CD") drive, an optical drive, and the like.

While the data storage device 106 is depicted in FIG. 1 as a single storage device, the data storage device 106 may include two or more storage devices. The data storage devices 106 may be configured as a redundant array of independent drives ("RAID"), just a bunch of disks ("JBOD"), and the like. The data storage devices 106 may be configured with one or more data storage devices 106, such as solid-state storage, configured as high-performance, short-term storage and one or more data storage devices 106, such as hard disk drives, configured as lower-performance, long-term storage. In this embodiment, the storage controller 104 may manage the various types of data storage devices 106. One of skill in the art will appreciate other types and configurations of data storage devices 106.

The storage controller 104 may control one or more data storage devices 106 and may be a RAID controller, a controller for a storage area network ("SAN"), etc. The storage controller 104 may include one or more sub-controllers. The storage controller 104 may be integrated with the storage device 106 or may be separate. The storage controller 104 may be integrated together or distributed. For example, a portion of the storage controller 104 may be a master controller and other portions of the storage controller 104 may be sub-controllers or slave controllers. The master controller may be a device in communication with other sub-controllers that in turn control data storage devices 106, or may be a master controller that controls slave controllers as well as a data storage device 106. One of skill in the art will recognize other forms and functions of a storage controller 104.

In one embodiment, the storage device 102 is included in a server 108. In various embodiments, either the storage controller 104 or data storage device 106 or both may be located external to the server 108. The server 108 may be connected to the storage controller 104 or the storage controller may be connected to the data storage device 106 over a system bus, such as a peripheral component interconnect express ("PCI-e") bus, a Serial Advanced Technology Attachment ("serial ATA") bus, or the like.

In another embodiment, the solid-state storage device 102 is external to the server 108 or storage device 102 and may be connected through a universal serial bus ("USB") connection, an Institute of Electrical and Electronics Engineers ("IEEE") 1394 bus ("FireWire"), etc. In other embodiments, the storage device 102 is connected to the server 108 or the storage controller 104 is connected to the data storage device 106 using a peripheral component interconnect ("PCI") express bus using an external electrical or optical bus extension or networking solution such as Ethernet, Fibre Channel, Infiniband, or PCI Express Advanced Switching ("PCIe-AS"), or the like. One of skill in the art will recognize a wide variety of possible connection methods.

The server 108 may also instead be a personal computer, lap-top computer, mainframe computer, workstation, electronic device, etc. The server 108 may include a client 110 or be connected to a client 110 over a computer network 112. The system 100 may include any number of computers, clients 110, computer networks 112, or other electronic device, as long as the system 100 is capable of transmitting a storage request to the storage device 102. The client 110 may be a process running on the server 108 or on another computer or electronic device. The client 110 may also be a personal computer, lap-top computer, mainframe computer, workstation, electronic device, etc. One of skill in the art will recognize other components and configurations of a system 100 capable of transmitting a storage request to the storage device 102.

Figure 2:
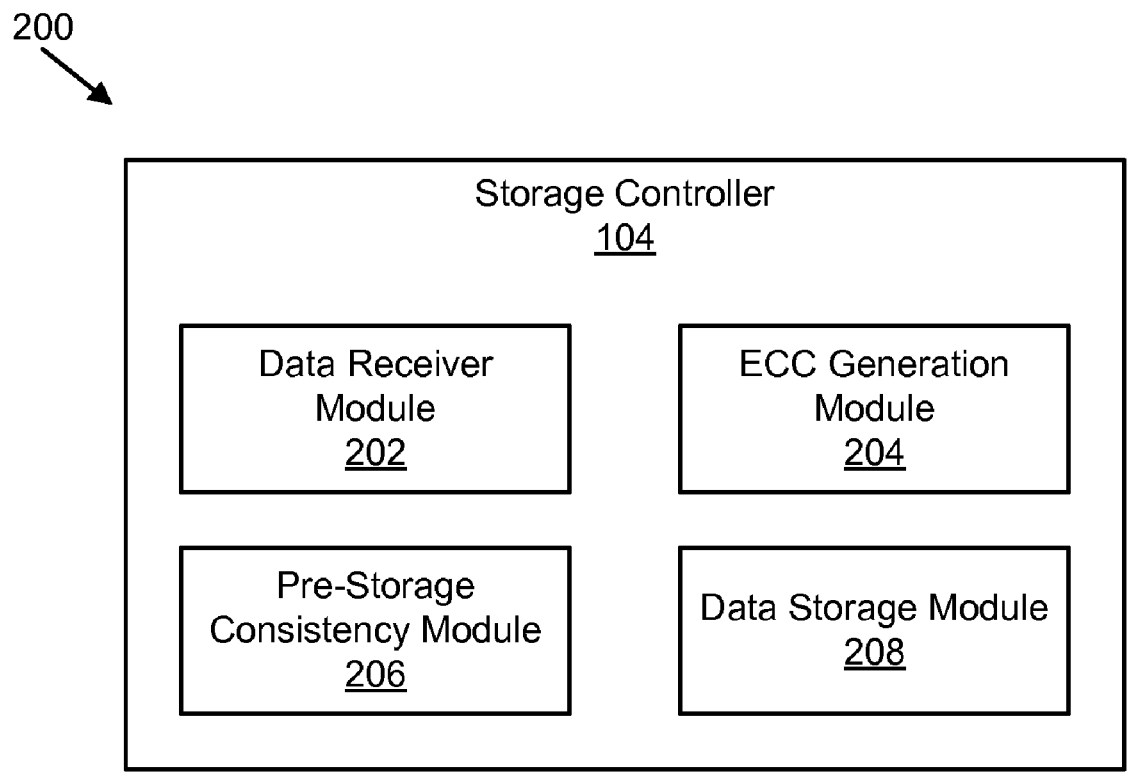
FIG. 2 is a schematic block diagram illustrating one embodiment of an apparatus for increasing data protection in a data storage process in accordance with the present invention.

FIG. 2 is a schematic block diagram illustrating one embodiment of an apparatus 200 for increasing data protection in a data storage process in accordance with the present invention. The apparatus 200 includes a data receiver module 202, an ECC generation module 204, a pre-storage consistency module 206, and a data storage module 208, which are described below. While the modules 202-208 are depicted in a storage controller, all or a portion of each module 202-208 may be located external to the storage controller 104. For example, all or a portion of the modules 202-208 may be located in the data storage device 106.

The apparatus 200 includes a data receiver module 202 that receives a storage block and existing parity information for the storage block. The storage block includes data that is intended to be stored together on the data storage device 106.

The storage block may be any convenient size for storing the data of the storage block. The storage block, for example, may include data of a data packet that has been processed, encrypted, compressed, etc. and then divided into an appropriate size convenient for storage on the data storage device 106.

The storage block may include at least a portion of one or more data packets. A data packet may include data from a file or object. The data from the file or object may be transmitted to the storage controller 104 as a data segment that may include complete file or object or a portion of the file or object. The storage controller 104 may divide data of a data segment into data packets of a uniform size and adds a data packet header. The data packet header may include one or more of a logical address of the file or object, an offset, and a data length.

Typically, as part of a storage request to write data, the storage controller 104 receives a data segment over some type of transmission means such as a system bus (not shown) or computer network 112 ("network"). Typically, the data segment is encoded using some error detection method such as 8b10b protection. Once the storage controller 104 receives the encoded data segment, the data segment is decoded and parity information is generated. Basic parity protection typically involves using an exclusive OR ("XOR") function to XOR bits of the data segment together to generate a parity bit.

For more complex parity, parity bits may be generated in multiple dimensions to form the parity information. The parity information can then be used to check the data to determine if any bit errors exist. One of skill in the art will recognize other ways to generate parity information and to use the parity information to check for bit errors in the data. The data receiver module 202 receives existing parity information that was generated for the data of the storage block in a process prior to storing the data on the data storage device 106.

The apparatus 200 includes an ECC generation module 204 that generates error correcting code ("ECC") check bits for the data of the storage block in response to the data receiver module 202 receiving the storage block and the existing parity information. The ECC check bits for the storage block may be generated by the ECC generation module 204 using a block code, such as a BCH code or Reed-Solomon Code, a convolutional code, such as a turbo code, or other standard code.

The selected ECC typically detects a certain number of bit errors and is capable of correcting a certain number of bit errors. For example, an ECC may detect five bit errors and may correct two bit errors. The ECC generation module 204 generates ECC check bits that are stored with the data of the storage block so that when the storage block with the data and ECC check bits is later read, the ECC check bits can then be used to detect and correct bit errors that may have been introduced in the storage process, read process, or while the data is stored on the data storage device 106. One of skill in the art will recognize other error correcting codes and will understand how to implement an ECC to generate ECC check bits for a storage block.

The apparatus 200 includes a pre-storage consistency module 206 that uses the data of the storage block, the existing parity information, and the ECC check bits to determine if the data of the storage block, the existing parity information, and the ECC check bits are consistent. In a preferred embodiment, the pre-storage consistency module 206 operates independently from the ECC generation module 204 providing redundancy in the error detection process. Preferably, the pre-storage consistency module 206 and the ECC generation module 204 are implemented with different logic hardware and/or different executable code so that an error in logic in the ECC does not cause the same error in the pre-storage consistency module 206. Beneficially, this redundancy provides a robust error detection capability that has no gaps in error detection and checks both data errors and logic errors.

The apparatus 200 include a data storage module 208 that stores the data of the storage block and the ECC check bits for the storage block on the data storage device 106 and the existing parity information for the storage block is not stored on the data storage device 106. Beneficially, by determining if the data, the existing parity, and the ECC check bits are consistent prior to storage, the existing parity information can be dropped. Parity can then be regenerated when the data is read and the ECC check bits can be used to correct errors that may have occurred after the pre-storage consistency module 206 checks consistency of the data, existing parity, and ECC check bits.

Figure 3:
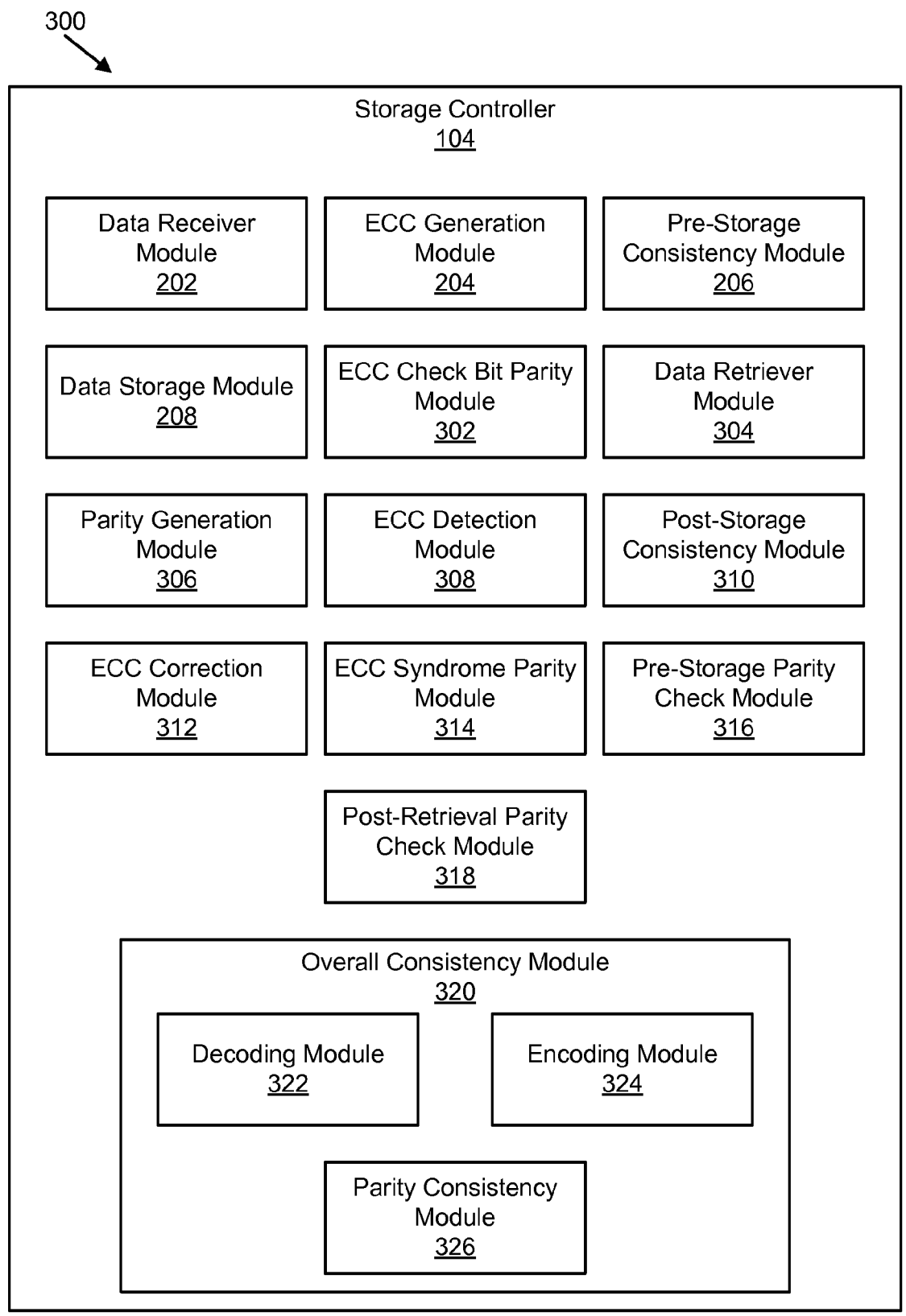
FIG. 3 is a schematic block diagram illustrating one embodiment of another apparatus for increasing data protection in a data storage process in accordance with the present invention.

FIG. 3 is a schematic block diagram illustrating one embodiment of another apparatus 300 for increasing data protection in a data storage process in accordance with the present invention. The apparatus 300 includes a data receiver module 202, an ECC generation module 204, a pre-storage consistency module 206, and a data storage module 208, which are substantially similar to those described in relation to the apparatus 200 of FIG. 2. The apparatus 300 includes an ECC check bit parity module 302, a data retriever module 304, a parity generation module 306, an ECC detection module 308, a post-storage consistency module 310, an ECC correction module 312, an ECC syndrome parity module 314, a pre-storage parity check module 316, a post-retrieval parity check module 318, and an overall consistency module 320 that includes a decoding module 322, an encoding module 324, and a parity consistency module 326, which are described below. As with the modules 202-208 of the apparatus 200 of FIG. 2, the modules 302-326 are depicted in the storage controller 104 but all or a portion of each module 302-326 may be located external to the storage controller 104, such as in the data storage device 106 or in a driver in a client 110 or server 108.

In one embodiment, the pre-storage consistency module 206 determines consistency using ECC parity information. In one embodiment, the apparatus 300 includes an ECC check bit parity module 302 that generates ECC parity information from the ECC check bits. Typically, the ECC check bit parity module 302 generates ECC parity information by XORing the ECC check bits. Where the ECC check bits are a single column, the ECC parity information may be reduced to a single ECC parity bit that is the parity of the ECC check bits. The pre-storage consistency module 206 determines if the ECC parity information is consistent with alternate parity information derived using independent logic from the data of the storage block and the existing parity information for the data.

The pre-storage consistency module 206 may determine if the ECC parity information is consistent with the alternate parity information by XORing the ECC parity information and the alternate parity information. Where there is a single ECC parity bit and the alternate parity information is a single bit, XORing the bits will typically represent a consistent result if the output of the XOR function is zero. If the output of the XOR function is a one, then the data, existing parity, and ECC check bits are not consistent and an error in at least one bit is present.

FIGS. 4A and 4B collectively are an example 400 of determining if data, parity, and ECC are consistent in accordance with the present invention. The example 400 depicts a simplified BCH(15,7,5) encoder and syndrome generation module. For this example 400, a 12 bit data block is chosen comprising bits (d0-d11) 402 in four rows and three columns. A parity bit is provided for each column (p0-p2) 404.

The BCH encoder generates 8 check bits, sufficient to correct 2 bit errors in the data block. While this may not be an especially attractive selection for a real world application, it enables sufficient explanation for one skilled in the art to extrapolate this to a larger and more sophisticated correction codes.

The EncoderDataPrecalculator Module calculates nine intermediate solutions IS[0:8] for use as inputs d[0:8] to the Feedback Module, which are implemented in a pipeline fashion. The EncoderDataPrecalculator Module polynomials are used to calculate IS[0:8]. One column of data 402 is input during a single clock cycle as i[0:3] with the input of the parity 404 as i[4]. IS[8] is the parity of the intermediate solutions, IS[0:7].

Consistent with the intent of the invention, IS[8] is calculated using the data inputs i[0:3] and parity input i[4], not the intermediate solutions IS[0:7] or any subset of logic for any of the checkbit polynomials; this ensures that errors due to failures in the logic for IS[0:7] are not propagated to IS[8] and therefore undetectable.

The polynomials for IS[0:7] have been obtained from generally available software. The polynomial for IS[8] is derived as follows:

1. Each of the polynomials for IS[0:8] in the EncoderPreCalcData Module are repeated in tabular form in rows 2-9 and row 13, respectively in Table 1 in FIG. 4A. The polynomials for IS[0:7] are XORed together (row 10). Since the XOR of the results of the polynomials is equal to the result of the XOR of the polynomials, this enables an independent calculation of the parity of the intermediate solutions. In Table 1, "1's" are placed in the cells of the table when the coefficients of the polynomials are "1," and left blank when the coefficients are "0." For example, the coefficient for i[0] in the XOR(IS[0:7]) polynomial (row 10) is "0" because i[0] is used in an even number polynomials (e.g. the polynomials corresponding to IS[0,4,6,7]), and i[0] XORed with itself four times is "0". The coefficient i[2] for the XOR(IS[0:7]) is "1" because i[2] is used in an odd number of polynomials (e.g. the polynomials corresponding to IS[1,2,5,6,7]). Note that the parity of the column of input data, i[4], is not included in this calculation.

2. The Parity_1a polynomial (row 11) contains only i[4] as an input, the identity function for i[4]. The Parity_2a polynomial (row 12) has inputs i[0:3], which is the same function that i[4] was created from originally (not shown). Since Parity_1a=Parity_2a, XOR(Parity_1a, Parity_2a)=0. The Parity_1a and Parity_2a polynomials are therefore XORed with the XOR(IS[0:7]) polynomial (row 10), resulting in IS[8] (row 13). This is equivalent to inverting the coefficients of the XOR(IS[0:7]) polynomial (row 10).

Per requirement, IS[8] is derived from the inputs i[0:4], not the intermediate solutions IS[0:7]. Additionally, the calculation for IS[8] includes as input the parity bit i[4], thus ensuring that the data protection is carried through this module and simultaneously ensuring that there is no shared logic that would negatively impact error detection.

While this example shows a single parity bit per column, it is a simple extension to use more than one. As larger data blocks are used, with larger number of inputs to the polynomials, and more polynomials (checkbits) are added to improve correction capability, the process used to derive the polynomial for the parity of the intermediate solutions remains the same.

In the Feedback Module i[0:8] are initialized to zero and then the Intermediate Solutions, IS[0:8] from the EncoderDataPrecalculator Module are input one column at a time as d[0:8] as described above. In the N+1 cycle, $i_{N+1}[0:8]=o_N[0:8]$.

In Table 2 in FIG. 4B, the input values for d[0:8] are left out of the XOR of the polynomials, and are not represented here. Otherwise, the scheme is the same as that above: the XOR of the o[0:7] polynomials (rows 2-9) is represented as the XOR (o[0:7]) polynomial (row 10). Parity_1b is the identify polynomial for i[8]. Parity_2b is generated from the inputs i[0:7]. These polynomials (rows 10-12) are XORed to create the o[8] polynomial (row 13).

The output of this polynomial is the checksum of the check bits [0:7]=o[0:7]. Per requirements to maintain redundancy, the polynomial is generated without use of the checkbit polynomials, and carries the parity information input as i[8] through to o[8]. To ensure this is the case, this logic must be synthesized in order to ensure the independence of the calculations in o[8] from those of o[0:7].

Prior to saving the data to the media, the parity of each column of data is checked, in addition to checking that the parity o[8] matches a generated parity from the checkbits o[0:7]. The decoder and syndrome modules work in the same way as encoding described above. This concludes the example 400.

In one embodiment, the apparatus 300 includes a data retriever module 304, a parity generation module 306, an ECC detection module 308, a post-storage consistency module 310, an ECC correction module 312, and an ECC syndrome parity module 314, which typically operate with regard to a read request and are described below.

The data retriever module 304 retrieves a storage block with data from one or more data packets stored on the data storage device 106 and ECC check bits for the storage block in response to a read request. The retrieved storage block and associated ECC check bits typically were stored previously by the data storage module 208 after the ECC check bits were generated by the ECC generation module 204 and consistency checked by the pre-storage consistency module 206. The parity generation module 306 generates parity information for the data of the retrieved storage block and for the ECC check bits. Typically, the parity generation module 306 generates the parity information in the same form as the existing parity information that was dropped after the pre-storage consistency module 206 determines consistency. In addition, the parity generation module 306 generates parity for the ECC check bits.

The ECC detection module 308 uses the ECC check bits stored in conjunction with the storage block to generate an ECC syndrome to determine if the data of the retrieved storage block and the generated parity has an error. The apparatus 300 typically includes an ECC correction module 312 that corrects one or more errors in the data of the storage block and updates one or more of parity bits in response to the ECC detection module 308 determining that the data of the retrieved storage block and the generated parity has an error. In a typical ECC, detection and correction of errors is handled simultaneously using the generated ECC syndrome and a feedback function to iteratively detect and correct errors.

In one embodiment, the ECC check bits are for the data of the storage block and do not include the parity bits. This is advantageous because if the ECC check bits are generated using both the data and the existing parity information, any error that occurs in the data will be reflected in the parity once the parity generation module 306 generates parity information after the storage block is read by the data retriever module 304. If the ECC syndrome spans the data and the generated parity, one bit within the data will cause a change to the parity information so the ECC detection and correction modules 308, 312 will have to use the syndrome to correct two bits; one in the data and then in the parity.

This may cut the number of correctable bits by the ECC in half. By ensuring consistency using the pre-storage consistency module 206 and then dropping the parity, the ECC generation module 204 need not span the existing parity in addition to the data so that when the ECC detection module 308 generates the syndrome, the syndrome covers only the data and not the generated parity. Of course, with any correction to the data, the ECC correction module 308 will typically regenerate the parity, at least for the column of the data with the corrected error. However, while not a preferred embodiment, the present invention may include an embodiment where the ECC generation module 204 spans the existing parity along with the data. One of skill in the art will recognize other ways to use ECC check bits to detect and correct bit errors in the data.

The post-storage consistency module 310 uses the data from the retrieved storage block, the generated parity information generated by the parity generation module 306, and the ECC syndrome to determine if the data, generated parity information, and the ECC syndrome are consistent. Again, in a preferred embodiment the post-storage consistency module 310 is independent from the ECC detection and correction modules 308, 312. This redundancy provides a more robust error detection that helps to ensure data integrity as well as a check on the logic of the ECC and the post-storage consistency module 310.

In one embodiment, the apparatus 300 includes an ECC syndrome parity module 314 that uses the ECC syndrome to generate ECC syndrome parity information. The post-storage consistency module 310 uses the ECC syndrome parity information to determine consistency. This is similar to the function of the ECC check bit parity module 302 and how the pre-storage consistency module 206 uses the ECC check bit parity information. The post-storage consistency module 310 uses the data of the retrieved storage block and the generated parity information in a function independent from the ECC detection and correction modules 308, 312 and the ECC syndrome parity module 314 to generate alternate parity information. The alternate parity information is checked against the ECC syndrome parity information to determine consistency. In one embodiment, the post-storage consistency module 310 and the ECC detection and correction modules 308, 312 use a process essentially similar to that described in the example depicted in FIG. 4.

In one embodiment, the apparatus 300 includes a pre-storage parity check module 316 that checks parity of the data of the storage block received by the data receiver module 202 using the existing parity information and the parity of the ECC check bits. The pre-storage parity check module 316 checks parity prior to the data storage module 208 storing the storage block and ECC check bits. The pre-storage parity check module 316 is typically another check that the received data does not have an error.

Timing of the parity check may help to ensure no gap in error detection capability. Preferably, the pre-storage parity check module 316 may checks parity after the ECC generation module 204 has generated ECC check bits or as part of the ECC check bit generation process. By checking parity after or during the ECC check bit generation process, the pre-storage parity check module 316 helps to ensure that there have been no bit errors up to and including processing to generate ECC check bits where the data is then protected by the ECC check bits.

On the read side, the apparatus 300 includes, in one embodiment, a post-retrieval parity check module 318 that checks parity of the retrieved storage block and the ECC check bits using the generated parity information from the retrieved storage block and ECC check bits after the ECC detection and correction modules 308, 312 have completed determining if the data of the retrieved storage block has an error. Again, checking parity after ECC detection and correction typically ensures no gap in error detection capability.

In one embodiment, the apparatus 300 includes an overall consistency module 320 that maintains protection of the data with no gap in error detection capability from receipt of the data by the system 100 until the data storage module 208 stores the data of the data segment. The overall consistency module 320 typically includes a sub-module associated with each transition from one data protection scheme to another. For example, the system may include the storage device 102 with the storage controller 104 and the data storage device 106. The system 100 may then receive a data segment over a network 112 or a system bus (not shown).

Typically, the data segment will be encoded to protect the data during transmission. For example, the data segment may be protected using an 8b/10b protection scheme or similar data transmission protection scheme. Once the coded data segment is received, the storage controller 104 decodes the data and generates parity for the data. A portion of the overall consistency module 320 ensures no gap in error detection capability through the decoding/parity generation processes. For example, the overall consistency module 320 may include a decoding module 322 that decodes data of the data segment, resulting in parity and un-encoded data of the data segment, in a single process step such that there is no gap in error detection capability from when the data is in an encoded form to when the data includes parity information. For the 8b/10b example, the decoding module 322 includes a decoder that simultaneously generates parity so there is no gap in protection.

In another embodiment, the overall consistency module 320 includes an encoding module 324 that encodes data of the data segment protected with parity information, resulting in encoded data of the data segment, in a single process step such that there is no gap in error detection capability from when the data includes parity information to when the data is in an encoded form. For example, as described above the parity generation module 306 generates parity information for read data. After processing the data may then be transmitted to a requesting device such as the client 110 or server 108. Typically the data is encoded and may be encoded again using an 8b/10b encoding scheme. The encoding module 324 checks parity using the generated parity information and encodes the data in a single step so that there is no gap in error detection capability.

In another embodiment, the overall consistency module 320 includes a parity consistency module 326 that maintains no gap in error detection capability by using parity information for the data of the data segment from when parity information is generated for the data of the data segment until the data receiver module 202 receives the existing parity information and the data in the form of the storage block. In addition, the parity consistency module 326 maintains no gap in error detection capability from when the data retriever module 304 retrieves the storage block and the parity generation module 306 generates parity information for the data until the data protected using parity information is encoded by the encoding module 324. In another embodiment, the Parity Consistency Module 326 maintains that there is no gap in data protection from the time the data is received and decoded by the Decoding Module 322, through to storage in the Data Storage Device 106, retrieval from the Data Storage Device 106, and then transmitted by the Encoding Module 324.

The parity consistency module 326 maintains parity through various processing steps such as encrypting the data, compressing the data, decrypting the data, decompressing the data, and/or a user-defined, application-specific function. For example, the parity consistency module 326 may work in conjunction with an encryption process so that there is no gap in protection during encryption. One of skill in the art will recognize other processing steps where the parity consistency module 326 may maintain no gap in protection.

In other embodiments, the system 100 may include a system bus, network 112, or other devices and components. The overall consistency module 320 may then include other decoding modules 322, encoding modules 324, modules similar to the parity consistency module 326, or other modules and sub-modules to maintain consistency of protection such that there is no gap in error detection capability from a CPU or memory within the server 108 or other computer where the data segment is located, throughout processing and transmission, during storage, and throughout being read, processed, transmitted, etc. back to the CPU or memory. The CPU and/or memory may include some error detection scheme and the overall consistency module 320 may maintain protection from inside the memory or CPU. One of skill in the art will recognize other processes, devices, and components in the system 100 and modules or sub-modules that may work together with the overall consistency module 320 to ensure consistency such that there is no gap in error detection capability.

Figure 5:
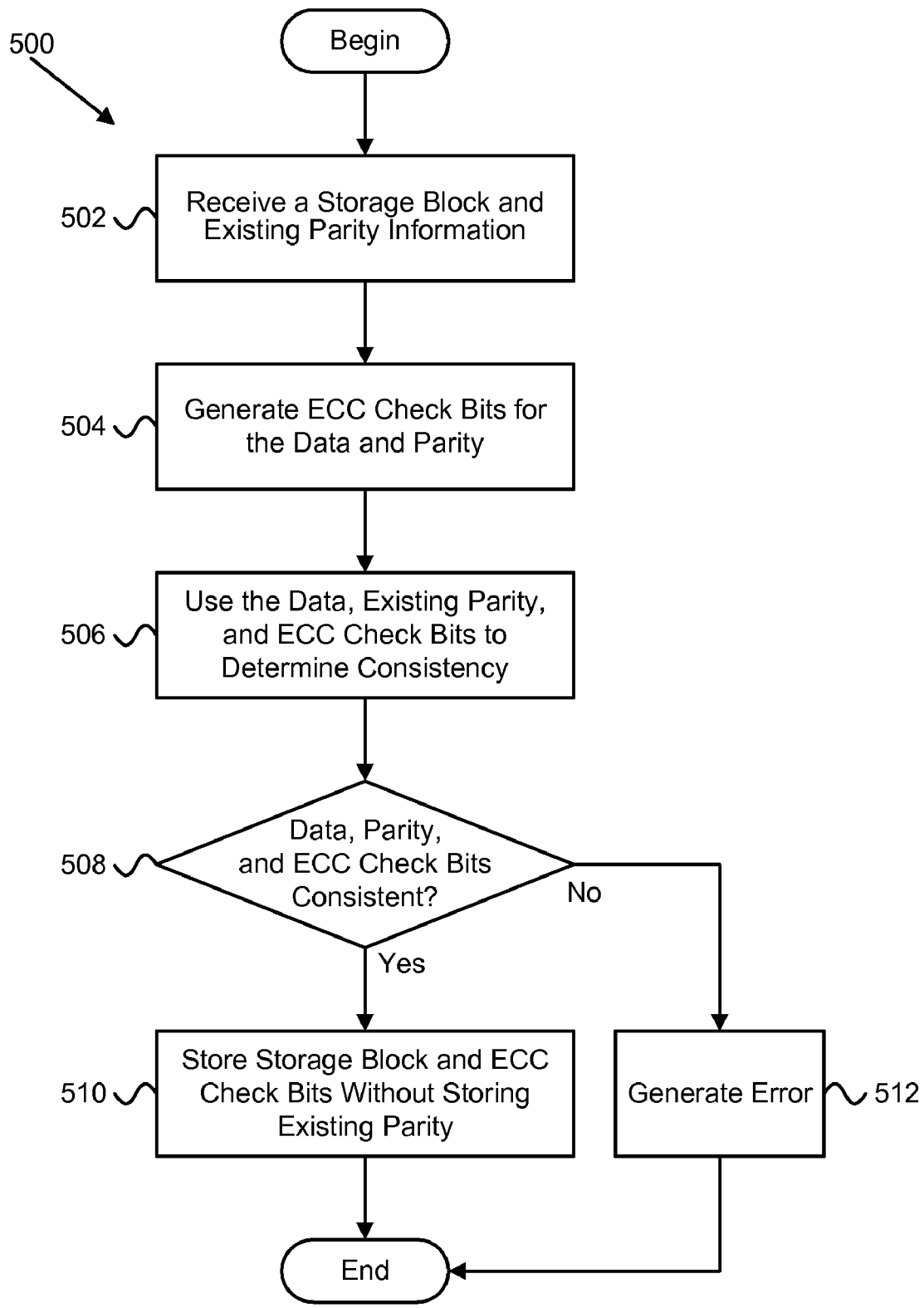
FIG. 5 is a schematic flow chart diagram illustrating one embodiment of a method for increasing data protection while storing data in accordance with the present invention.

FIG. 5 is a schematic flow chart diagram illustrating one embodiment of a method 500 for increasing data protection while storing data in accordance with the present invention. The method 500 begins and the data receiver module 202 receives 502 data in the form of a storage block and associated existing parity information. The ECC generation module 204 generates 504 ECC check bits for the data of the storage block. The ECC check bits are generated using a standard code such as a block code or convolutional code.

The pre-storage consistency module 206 uses 506 the data of the storage block, the existing parity information, and the ECC check bits to determine if the data of the storage block, the existing parity information, and the ECC check bits are consistent. Typically the ECC check bit parity module 302 generates ECC check bit parity information and an independent logic uses the data and existing parity information to generate alternate parity information that is checked against the ECC check bit parity information.

If the pre-storage consistency module 206 determines 508 that the data, existing parity and ECC check bits are consistent, the data storage module 208 stores 510 the data as a storage block along with the ECC check bits. The existing parity information is dropped and not stored. If the pre-storage consistency module 206 determines 508 that the data, existing parity and ECC check bits are not consistent, the pre-storage consistency module 206 generates 512 an appropriate error and the method 500 ends. The storage controller 104 typically then takes appropriate action to correct the error or fail the storage request.

Figure 6:
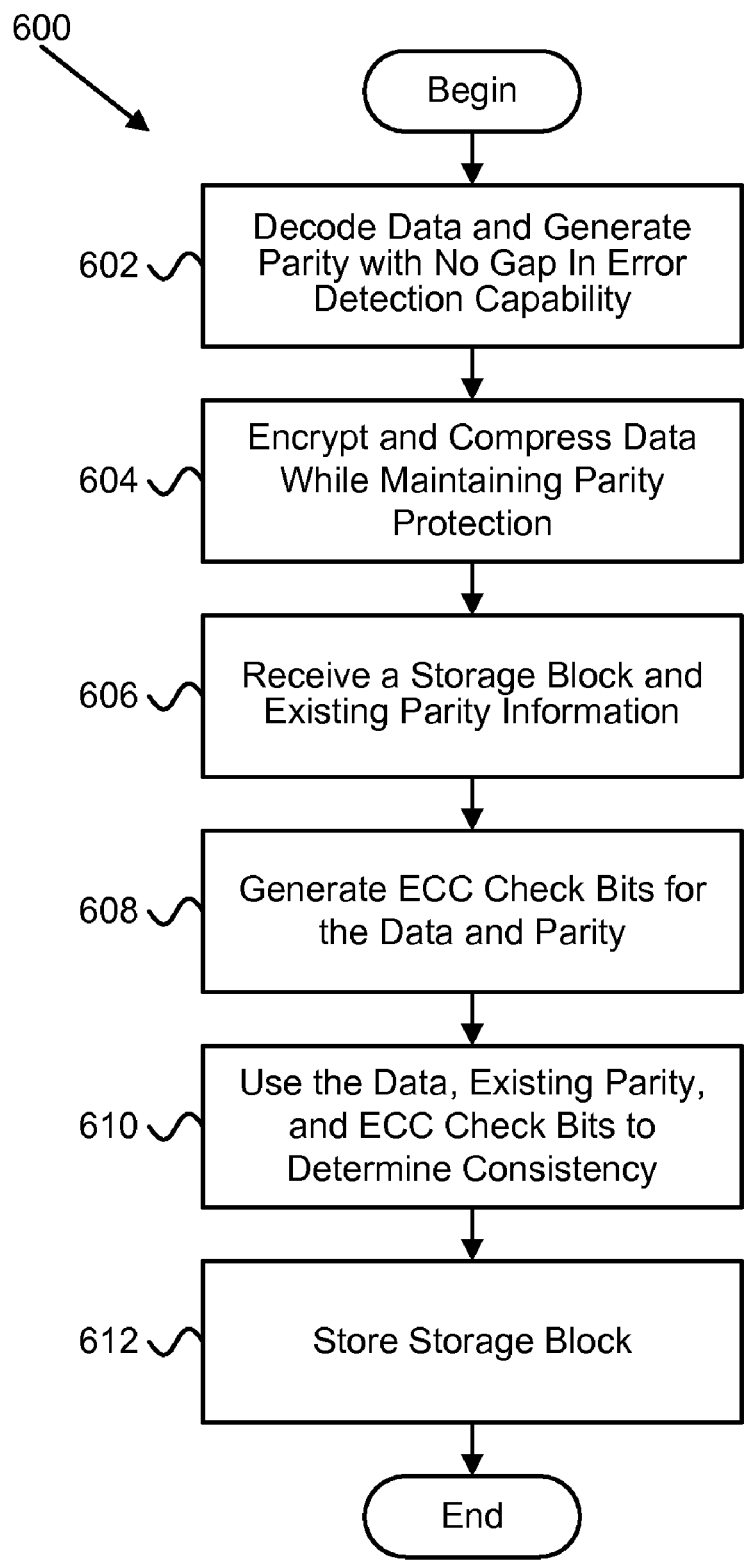
FIG. 6 is a schematic flow chart diagram illustrating one embodiment of a method for increasing data protection from receipt of the data to storage of the data in accordance with the present invention.

FIG. 6 is a schematic flow chart diagram illustrating one embodiment of a method 600 for increasing data protection from receipt of the data to storage of the data in accordance with the present invention. The method 600 is for a system 100 that includes a storage device 102 with a storage controller 104 and a data storage device 106. The method 600 begins and the decode module 322 decodes 602 data of a data segment and generates parity information for the data such that there is no gap in error detection capability. The storage controller 104 processes the data and the parity consistency module 326 maintains 604 parity protection such that there is no gap in parity protection for the data through encryption, compression, etc. until the data and existing parity are received by the data receiver module 202.

The data receiver module 202 receives 606 the data and existing parity information and the ECC generation module 204 generates 608 ECC check bits for the data using a standard code such as a block code, a convolutional code, etc. The pre-storage consistency module 206 uses 610 the data, ECC check bits, and existing parity information to determine consistency. If the data, parity information, and ECC check bits are consistent, the data storage module 208 stores 612 the data and ECC check bits on the data storage device 106 without storing the existing parity information and the method 600 ends. Of course, one of skill in the art will recognize that any errors detecting during decoding, processing, generation of the ECC check bits, etc. will be handled appropriately by the storage controller 104.

Figure 7:
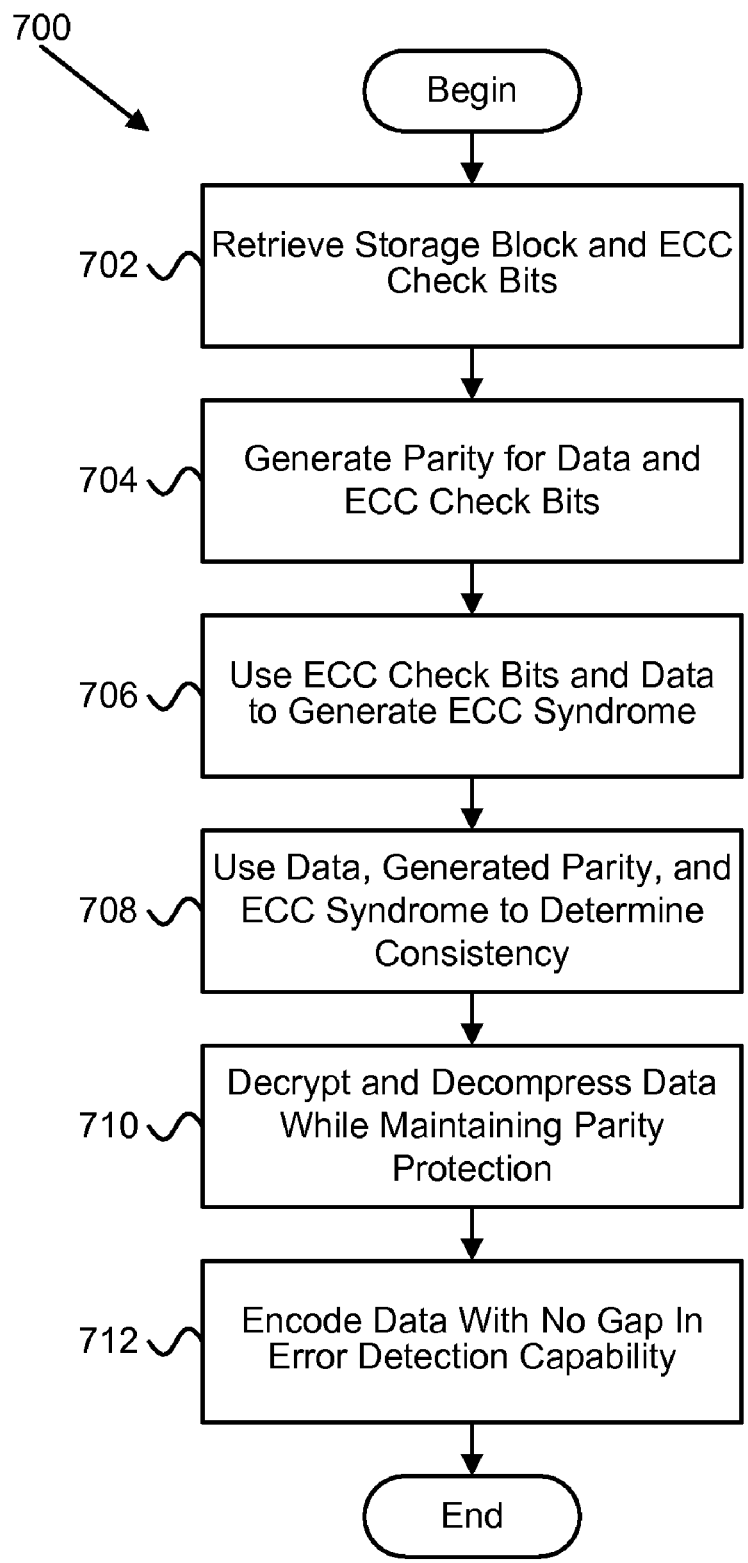
FIG. 7 is a schematic flow chart diagram illustrating one embodiment of a method for increasing data protection from retrieval of data to delivering the data in accordance with the present invention.

FIG. 7 is a schematic flow chart diagram illustrating one embodiment of a method 700 for increasing data protection from retrieval of data to delivering the data in accordance with the present invention. The method 700 is for a system 100 that includes a storage device 102 with a storage controller 104 and a data storage device 106. The method 700 begins and the data retriever module 304 retrieves 702 a storage block stored on the data storage device 106 and ECC check bits for the storage block in response to a read request. The parity generation module 306 generates 704 parity information for the data of the retrieved storage block and for the ECC check bits. The ECC detection module 308 generates 706 an ECC syndrome using the data of the retrieved storage block and the corresponding ECC check bits and determines if there are one or more errors in the data. The ECC correction module 312 typically works with the ECC detection module 308 to iteratively detect and correct errors.

The post-storage consistency module 310 uses 708 the ECC check bits, the generated parity information, and the ECC syndrome to determine if the data, parity, and ECC syndrome are consistent. If not, the storage controller 104 takes appropriate action or the ECC detection and correction modules 308, 312 continue to iterate to correct the errors. The storage controller 104 processes the read data and the parity consistency module 326 maintains 710 parity protection while the data is decrypted, decompressed, etc. The encoding module 324 encodes 712 the data and checks parity in a single step so that there is no gap in error detection capability and the method 700 ends. Again, any errors detected through parity checks, ECC error detection, etc. are handled appropriately by the storage controller 104.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An apparatus to protect data, the apparatus comprising:
an ECC generation module configured to generate error correcting code ("ECC") check bits for data of a storage block in response to receiving the storage block and existing parity information generated for the storage block;
a pre-storage consistency module configured to use the data of the storage block, the existing parity information, and the ECC check bits to determine if the data of the storage block, the existing parity information, and the ECC check bits are consistent; and
a data storage module configured to store the data of the storage block and the ECC check bits for the storage block on a data storage device, wherein the existing parity information for the storage block is not stored on the data storage device;
wherein the ECC generation module, the pre-storage consistency module, and the data storage module comprise one or more of logic hardware and executable code stored on a non-transitory computer readable medium.

2. The apparatus of claim 1, wherein the pre-storage consistency module is independent of the ECC generation module.

3. The apparatus of claim 1, further comprising an ECC check bit parity module configured to use the ECC check bits to generate ECC check bit parity information and wherein the pre-storage consistency module uses the ECC check bit parity information to determine consistency; wherein the ECC check bit parity module comprises one or more of logic hardware and executable code stored on a non-transitory computer readable medium.

4. The apparatus of claim 3, wherein the pre-storage consistency module is configured to use the data of the storage block and the existing parity information in a function independent from the ECC generation module and the ECC check bit parity module to generate alternate parity information and to check the alternate parity information against the ECC check bit parity information to determine consistency.

5. The apparatus of claim 1, further comprising:
a data retriever module configured to retrieve a storage block stored on the data storage device and ECC check bits for data of the retrieved storage block in response to a read request;
a parity generation module configured to generate parity information for the data of the retrieved storage block and for the ECC check bits;
an ECC detection module that uses the ECC check bits stored in conjunction with the retrieved storage block to generate an ECC syndrome to determine if the data of the retrieved storage block and the generated parity has an error;
and a post-storage consistency module configured to use the data from the retrieved storage block, the generated parity information generated by the parity generation module, and the ECC syndrome to determine if the data, generated parity information, and the ECC syndrome are consistent;
wherein the data retriever module, the parity generation module, the ECC detection module, and the post-storage consistency module comprise one or more of logic hardware and executable code stored on a non-transitory computer readable medium.

6. The apparatus of claim 5, further comprising an ECC correction module configured to correct one or more errors in the data of the storage block and to update one or more parity bits in response to the ECC detection module determining that the data of the retrieved storage block and the generated parity has an error; wherein the ECC correction module comprises one or more of logic hardware and executable code stored on a non-transitory computer readable medium.

7. The apparatus of claim 5, further comprising an ECC syndrome parity module configured to use the ECC syndrome to generate ECC syndrome parity information and wherein the post-storage consistency module is configured to use the ECC syndrome parity information to determine consistency; wherein the ECC syndrome parity module comprises one or more of logic hardware and executable code stored on a non-transitory computer readable medium.

8. The apparatus of claim 5, further comprising a post-retrieval parity check module configured to check parity of the retrieved storage block and the ECC check bits using the generated parity information from the retrieved storage block and ECC check bits in response to the ECC detection module completing determining if the data of the retrieved storage block has an error; wherein the post-retrieval parity check module comprises one or more of logic hardware and executable code stored on a non-transitory computer readable medium.

9. The apparatus of claim 1, wherein the ECC generation module is configured to generate an error checking code for the existing parity information of the storage block, the error checking code stored with the ECC check bits for the storage block.

10. The apparatus of claim 1, wherein the ECC generation module is configured to generate ECC check bits for the data of the storage block combined with the existing parity information such that the generated ECC check bits do not distinguish between data and parity information.

11. The apparatus of claim 1, further comprising a pre-storage parity check module configured to check parity of the data of the storage block using the existing parity information and a parity of the ECC check bits, wherein the parity check module checks parity prior to the data storage module storing the storage block and ECC check bits.

12. The apparatus of claim 1, further comprising a decoding module configured to decode data of the storage block, resulting in parity and un-encoded data of the storage block, in a single process step such that there is no gap in error detection capability; wherein the decoding module comprises one or more of logic hardware and executable code stored on a non-transitory computer readable medium.

13. The apparatus of claim 1, further comprising a parity consistency module configured to maintain no gap in error detection capability by using parity information for the data of the storage block from the decoding module generating the parity until the data receiver module receives the parity and the data in the form of the storage block, wherein the parity consistency module is configured to maintain parity through at least one of encrypting the data, compressing the data, and a user-defined, application-specific function; wherein the parity consistency module comprises one or more of logic hardware and executable code stored on a non-transitory computer readable medium.

14. The apparatus of claim 1, wherein the data storage module does not store parity information of the ECC check bits.

15. A system to protect data, the system comprising:
a data storage device;
a storage controller that controls storage of data in the data storage device;
an ECC generation module configured to generate error correcting code ("ECC") check bits for data of a storage block in response to receiving the storage block and existing parity information generated for the storage block;

a pre-storage consistency module configured to use the data of the storage block, the existing parity information, and the ECC check bits to determine if the data of the storage block, the existing parity information, and the ECC check bits are consistent; wherein the pre-storage consistency module is independent of the ECC generation module; and a data storage module configured to store the data of the storage block and the ECC check bits for the storage block on the data storage device in response to the pre-storage consistency module determining that the data of the storage block, the existing parity information, and the ECC check bits are consistent, wherein the existing parity information for the storage block is not stored on the data storage device;

wherein the ECC generation module, the pre-storage consistency module, and the data storage module comprise one or more of logic hardware and executable code stored on a non-transitory computer readable medium.

16. The system of claim 15, further comprising one or more of a system bus and a network, the storage controller configured to receive the storage block from one of a CPU and a memory over at least one of the system bus and the network.

17. The system of claim 15, further comprising an overall consistency module configured to maintain protection of the data with no gap in error detection capability from receipt of the data until the data storage module stores the data of the storage block; wherein the overall consistency module comprises one or more of logic hardware and executable code stored on a non-transitory computer readable medium.

18. The system of claim 15, wherein further comprising a decoding module configured to decode data of the storage block, resulting in parity and un-encoded data of the storage block, in a single process step such that there is no gap in error detection capability from when the data is in an encoded form to when the data includes parity information; wherein the decoding module comprises one or more of logic hardware and executable code stored on a non-transitory computer readable medium.

19. The system of claim 15, further comprising an encoding module configured to encode data of the storage block protected with parity information, resulting in encoded data of the storage block, in a single process step such that there is no gap in error detection capability from when the data includes parity information to when the data is in an encoded form; wherein the encoding module comprises one or more of logic hardware and executable code stored on a non-transitory computer readable medium.

20. A computer program product comprising a non-transitory computer readable medium having computer usable program code stored thereon, the code being executable to perform operations for protecting data, the operations of the computer program product comprising:

generating error correcting code ("ECC") check bits for data of a storage block in response to receiving the storage block and existing parity information generated for the storage block;

using the data of the storage block, the existing parity information, and the ECC check bits to determine if the data of the storage block, the existing parity information, and the ECC check bits are consistent; and storing the data of the storage block and the ECC check bits for the storage block on a data storage device in response to determining that the data of the storage block, the existing parity information, and the ECC check bits are consistent, wherein the existing parity information for the storage block is not stored on the data storage device.

21. A method for protecting data, the method comprising:

generating error correcting code ("ECC") check bits for data of a storage block in response to receiving the storage block and existing parity information generated for the storage block;

determining if the data of the storage block, the existing parity information, and the ECC check bits are consistent using the data of the storage block, the existing parity information, and the ECC check bits; and storing the data of the storage block and the ECC check bits for the storage block on a data storage device, wherein the existing parity information for the storage block is not stored on the data storage device.

22. The method of claim 21, further comprising:

generating ECC check bit parity information using the ECC check bits; and determine consistency using the ECC check bit parity information.

23. The method of claim 22, further comprising:

generating alternate parity information using the data of the storage block and the existing parity information; and checking the alternate parity information against the ECC check bit parity information to determine consistency.

24. The method of claim 21, further comprising:

retrieving a storage block stored on the data storage device and ECC check bits for data of the retrieved storage block in response to a read request;

generating parity information for the data of the retrieved storage block and for the ECC check bits;

generating an ECC syndrome, using the ECC check bits stored in conjunction with the retrieved storage block, to determine if the data of the retrieved storage block and the generated parity has an error; and determining if the data, the generated parity information, and the ECC syndrome are consistent using the data from the retrieved storage block, the generated parity information for the data of the retrieved storage block, and the ECC syndrome.

25. The method of claim 24, further comprising correcting one or more errors in the data of the retrieved storage block and updating one or more parity bits, each in response to determining that the data of the retrieved storage block and the generated parity has an error.

26. The method of claim 21, further comprising checking parity of the data of the storage block using the existing parity information and parity information for the ECC check bits prior to storing the storage block and ECC check bits.

27. The method of claim 21, further comprising decoding data of the storage block, resulting in parity and un-encoded data of the storage block, in a single process step without a gap in error detection capability.

* * * * *